United States Patent
Park

(10) Patent No.: US 6,323,693 B1
(45) Date of Patent: Nov. 27, 2001

(54) CURRENT SENSE AMPLIFIER CIRCUIT USING DUMMY BIT LINE

(75) Inventor: Min-sang Park, Yongin (KR)

(73) Assignee: Samsung Electronics Co., Ltd., Kyungki-do (KR)

(*) Notice: Subject to any disclaimer, the term of this patent is extended or adjusted under 35 U.S.C. 154(b) by 0 days.

(21) Appl. No.: 09/632,459

(22) Filed: Aug. 4, 2000

(30) Foreign Application Priority Data

Aug. 6, 1999 (KR) .................................................. 99-32310

(51) Int. Cl.[7] .................................................... G11C 7/06
(52) U.S. Cl. ............................................... 327/56; 327/52
(58) Field of Search .................... 327/51–57; 365/185.2, 365/185.21, 207, 208, 210

(56) References Cited

U.S. PATENT DOCUMENTS

| | | | |
|---|---|---|---|
| 5,191,552 | * 3/1993 | Nakai et al. | 365/210 |
| 5,559,737 | * 9/1996 | Tanaka et al. | 365/185.21 |
| 5,717,640 | * 2/1998 | Hashimoto | 365/210 |
| 5,886,546 | * 3/1999 | Hwang | 327/53 |
| 6,163,484 | * 12/2000 | Uekubo | 365/189.07 |

\* cited by examiner

*Primary Examiner*—Toan Tran
(74) *Attorney, Agent, or Firm*—Skjerven Morrill MacPherson LLP; David W. Heid

(57) ABSTRACT

A current sense amplifier circuit using a dummy bit line is provided. The current sense amplifier circuit includes a cell current generator, a reference current generator, and a sense amplifier. The cell current generator includes a memory cell connected to a word line and a bit line and generates memory cell current applied to the memory cell and bit line charge current for charging the bit line. The reference current generator includes a dummy bit line and a reference cell and generates reference cell current applied to the reference cell and dummy bit line charge current for charging the dummy bit line. The sense amplifier includes a first input terminal, connected to the cell current generator, for receiving the memory cell current and the bit line charge current and a second input terminal, connected to the reference current generator, for receiving the reference cell current and the dummy bit line charge current. The sense amplifier senses and amplifies the difference between current applied through the first input terminal and current applied through the second input terminal. The current sense amplifier circuit senses data at high speed regardless of the bit line charge current in the case of a turned-off cell and has a symmetric structure for stable operation.

17 Claims, 4 Drawing Sheets

CURRENT SENSE AMPLIFIER CIRCUIT USING DUMMY BIT LINE

BACKGROUND OF THE INVENTION

1. Field of the Invention

The present invention relates to a semiconductor memory device, and more particularly, to a current sense amplifier circuit using a dummy bit line.

2. Description of the Related Art

Basic operations of semiconductor memory devices such as dynamic random access memories (DRAMs), static random access memories (SRAMs), and flash memories are reading and writing of data. The operations that write data vary according to the type of memory, however, the operations that read data are generally similar because of similarities in memory architectures. In a conventional two-dimensional memory architecture, a word line connects to the gates of memory cell transistors in a row of memory cells, and a bit line connects to the sources or drains of the memory cell transistors in a column of memory cells. The operation of reading data in a typical semiconductor memory device is controlled by a signal, referred to as a read enable signal. A memory cell is selected by enabling a word line and a bit line connected to the memory cell. Therefore, reading data from the memory cell is possible only after the word line and the bit line are enabled.

In a flash memory, data is typically read by sensing the amount of current on a bit line. Therefore, a flash memory uses a current sense amplifier, which can sense and amplify the amount of current, to read data in the flash memory. The time taken for sensing the data stored in the memory cell depends on the time required for the sensed current to reach a stable state. For example, in the case where the word line voltage turns on the cell transistor (i.e., the memory cell transistor is erased and has a low threshold voltage), sensing a stable current greater than a predetermined reference current indicates a first data value. Sensing a stable current less than the reference current (e.g., when the memory cell transistor is programmed to a high threshold voltage) indicates a second data value. A cell in which the memory cell transistor turns on when the corresponding word line is enabled is referred to herein as a turned-on cell. A cell in which the memory cell transistor remains off when the corresponding word line is enabled is referred to herein as a turned-off cell. When the word line is enabled late, the speed at which data is sensed is reduced because a longer wait is required before the sensed current stabilizes.

FIG. 1 illustrates the operation of sensing data in the case of a turned-off cell in a conventional current sense amplifier circuit in a flash memory. Referring to FIG. 1, the x axis denotes data sensing time, and the y axis denotes the amount of current which flows through the bit line or the reference cell. Also, reference numerals T1, 12, and 14 respectively denote the time at which data is sensed, the reference current, and the bit line current. The reference current 12 maintains a uniform value, however, the bit current 14 has a large magnitude at an initial stage when the bit line is being charged. The conventional current sense amplifier circuit can sense data only when the component of the bit line current 14 that charges the bit line falls to a certain level with respect to the reference current 12. If reading is attempted to early, the conventional current sense amplifier circuit can read a turned-off cell as being in the state of a turned-on cell due to an excessive amount of current generated while the bit line is charging.

SUMMARY OF THE INVENTION

The present invention provides a current sense amplifier circuit capable of sensing data within a short time regardless of the amount of bit line charge current in the case of a turned-off cell. In one embodiment of the invention, a current sense amplifier circuit includes a cell current generator, a reference current generator, and a sense amplifier. The cell current generator comprises a memory cell connected to a word line and a bit line and generates memory cell current applied to the memory cell and bit line charge current for charging the bit line. The reference current generator comprises a dummy bit line and a predetermined reference cell and generates a reference cell current applied to the reference cell and a dummy bit line charge current for charging the dummy bit line. The sense amplifier comprises a first input terminal connected to the cell current generator, for receiving the memory cell current and the bit line charge current and a second input terminal connected to the reference current generator, for receiving the reference cell current and the dummy bit line charge current. The sense amplifier senses and amplifies the difference between current applied through the first input terminal and current applied through the second input terminal.

BRIEF DESCRIPTION OF THE DRAWINGS

The above aspects and advantages of the present invention will become more apparent by describing in detail an exemplary embodiment thereof with reference to the attached drawings in which.

DETAILED DESCRIPTION

Figure 1:
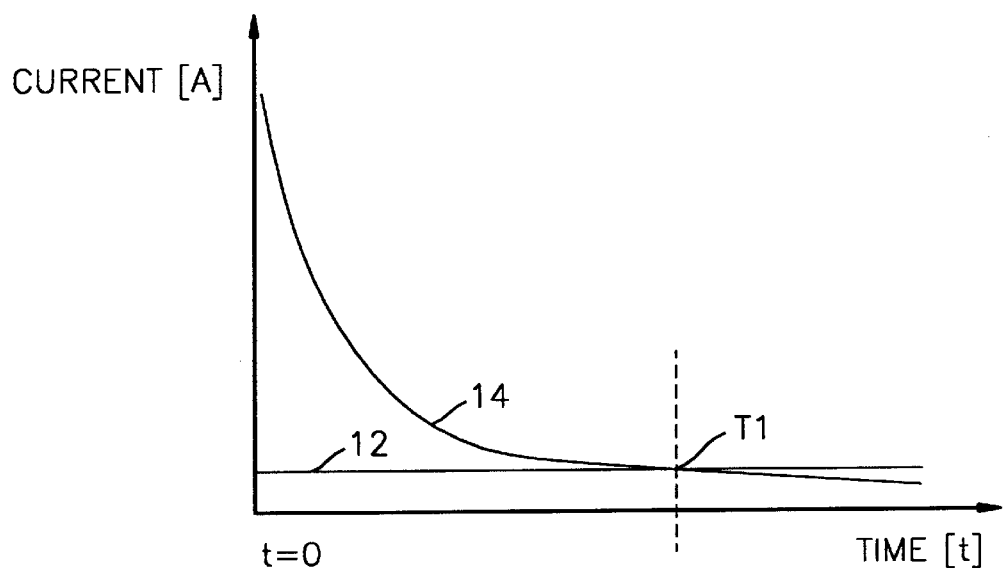
FIG. 1 illustrates the data sensing operation of a conventional current sense amplifier circuit in the case of a turned-off cell.
Figure 2:
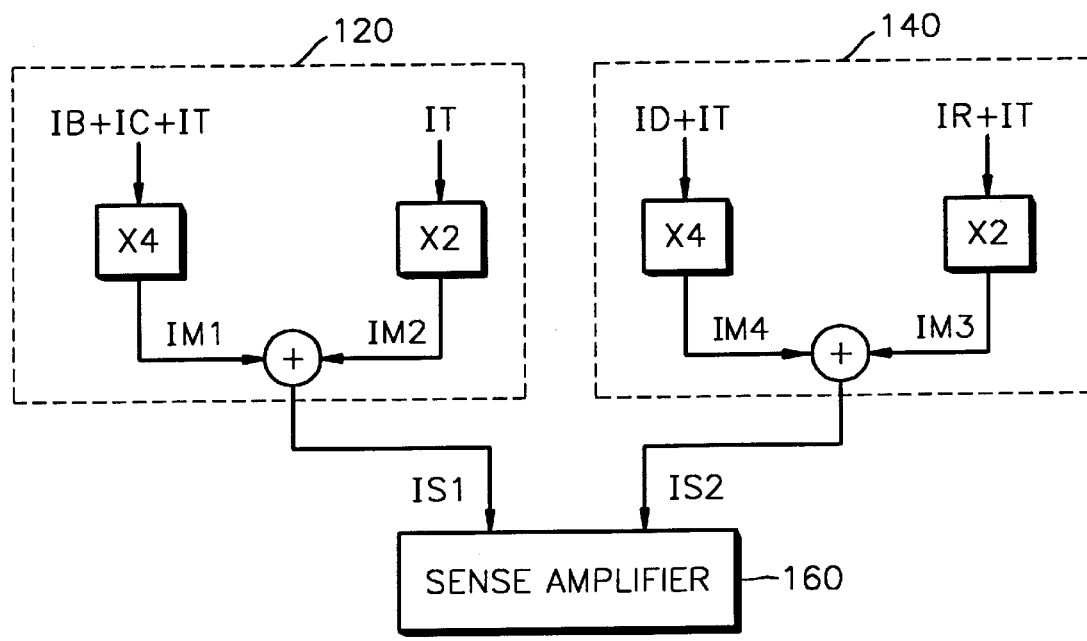
FIG. 2 shows current paths for sensing data in the case of the turned-off cell according to an embodiment of the present invention.

FIG. 2 shows current paths in a current sense amplifier circuit using a dummy bit line according to an embodiment of the present invention. Referring to FIG. 2, a sense amplifier 160 is connected to a cell current unit 120 and a reference cell current unit 140. The sense amplifier 160 senses the difference between a cell current IS1 of cell current unit 120 and a reference cell current IS2 of the reference cell current unit 140 and determines whether a memory cell transistor is on or off. When the memory cell is selected, the current IS1 of the cell current unit 120 transmitted to the sense amplifier 160 is the sum of a cell current IC, a bit line charge current IB, and an offset current IT. Here, the amount of cell current IC is determined by whether the cell is turned on or off. The bit line charge current is required for charging the parasitic capacitance of a bit line. The offset current IT represents the amount of leakage current according to the operation of sensing circuits.

The reference cell current unit 140 includes current components corresponding to the elements included in the cell current unit 120. The reference cell current IR, which maintains a constant direct current (DC) level, corresponds to the cell current IC, and the dummy bit line charge current ID corresponds to the bit line charge current IB. Additionally, the dummy bit line charge current ID is equal to the bit line charge current IB. Using a dummy bit line in reference cell current unit 140 that is substantially identical to the bit line in the cell current unit 120 can make the dummy bit line charge current ID equal to the bit line charge current IB. In a real circuit structure, the offset current IT is present and adds to the dummy bit line charge current ID and to the reference cell current IR.

In an exemplary embodiment, the reference current IS2 applied to the sense amplifier 160 is the sum of amplified versions of the reference cell current IR and the dummy bit line charge current ID. Also, in the reference cell current unit 140, the current path of the reference cell current IR is separated from the current path of the dummy bit line charge current ID so that each current can be independently amplified, permitting the amplification of dummy bit line charge current ID to be matched to the amplification of the bit line charge current IB. Accordingly, the sense amplifier 160 can detect the difference between the cell current IC and the reference cell current IR regardless of the amount of bit line charge current IB. Therefore, it is possible to increase the speed at which the reading operation of a memory is performed in the current sense amplifier circuit according to the present invention.

As shown in FIG. 2, since it is difficult to sense the amount of current generated at an initial stage during a read operation of the current sense amplifier circuit, the current is amplified to an appropriate level and sensed. Preferably, the sum of the cell current IC and the bit line charge current IB is amplified by a factor of about four. Namely, when the sum of the cell current IC and the bit line charge current IB to which the offset current IT is added is amplified, the current IM1 becomes 4*(IB+IC+IT).

Also, it is preferable that the offset current IT generated by one side of the cell current unit 120 is amplified by a factor of about two to offset the offset current generated elsewhere in the current sense amplifier circuit. The current obtained by amplifying the offset current IT is referred to as IM2. Also, it is preferable that the DC reference current to which the offset current IT is added (IR+IT) is amplified by a factor of two. Further, the current obtained by amplifying the reference current to which the offset current IT is added (IR+IT), is referred to as current IM3, where the current IM3 is 2*(IR+IT). The DC reference cell current IR, which is based on the current through a turn-on cell, is amplified by a factor of about two to let the amplification factor of current have margins of the same width in the cases of a turned-off cell and a turned-on cell. More specifically, the reference cell current IR is preferably about equal to the current through a turned-on cell and is amplified by about half the current amplification factor for the current IC. Thus, the current IM3 has an intermediate level between the amplified current in the case of the turned-on cell and the amplified current in the case of the turned-off cell.

The dummy bit line charge current ID to which the offset current IT is added (ID+IT) is preferably amplified by a factor of about four. The current obtained by amplifying the dummy bit line charge current to which the offset current IT is added (ID+IT), is referred to as current IM4, where the current IM4 is 4*(ID+IT). Therefore, the sense amplifier 160 of the current sense amplifier circuit can sense data by comparing first sense current IS1 obtained by adding IM1 to IM2 to the second sense current IS2 obtained by adding IM3 to IM4. The currents IC and IB cannot be divided since the cell current IC and the bit line charge current IB are always simultaneously applied to a bit line and amplified. However, the reference current can be amplified in a state where the reference current remains in a steady state and is separated from the dummy bit line.

In a memory structure where the bit line is not precharged, such as a flash memory, the amount of current which flows to the sense amplifier 160 is very large while charging the bit line. Therefore, a conventional sense amplifier always indicates the memory cell is in the turned-on cell state while the bit line is being charged. To increase speed at which data is sensed, it is preferable that the bit line charge current component is removed or offset. In the present invention, the bit line charge current is offset by the dummy bit line charge current.

As mentioned above, the current sense amplifier circuit according to the exemplary embodiment of the invention includes the dummy bit line having the same structure as the bit line, and charging the dummy bit line provides the dummy bit line charge current ID to offset the bit line charge current IB. The dummy bit line charge current ID is amplified by the same factor as the amplification of the bit line charge current IB. In the above-mentioned current sense amplifier circuit, a constant difference always exists between the bit line current and the reference current. The difference IDF between the first sense current IS1 and the second sense current IS2, which are compared to each other by the current sense amplifier of FIG. 2, is expressed as follows.

Equation 1:

$$\begin{aligned} IDF &= [(IB + IC + IT)*4 + IT*2] - \\ &\quad [(IR + IT)*2 + (ID + IT)*4] \\ &= (IB - ID)*4 + (IC*4 - IR*2) \\ &= IC*4 - IR*2 \\ &= \pm IR*2 \end{aligned}$$

Here, the offset current IT is offset and removed from each term. Also, the bit line charge current IB is offset by the dummy bit line charge current ID. Therefore, the magnitude of the current difference IDF is about twice the reference current IR regardless of the amount of the charge current. Namely, the current difference IDF is+IR*2 in the case of the turned-on cell because the cell current IC is about equal to the reference current IR for a turned-on cell. In the case of the turned-off cell, the current difference IDF is about −IR*2 since the cell current IC is about 0.

Figure 3:
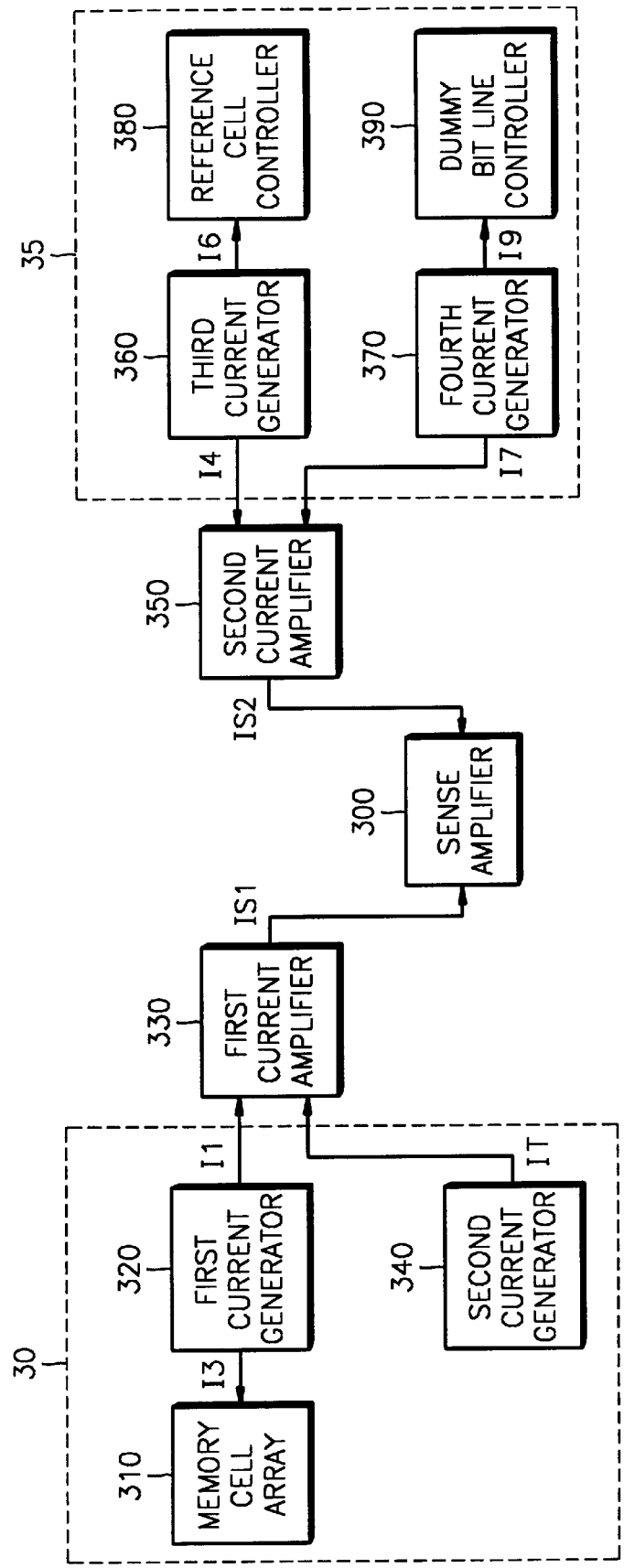
FIG. 3 is a block diagram of an embodiment for illustrating a current sense amplifier circuit using a dummy bit line according to the present invention.

FIG. 3 is a schematic block diagram of the current sense amplifier circuit using the dummy bit line according to the embodiment of the present invention. Referring to FIG. 3, the current sense amplifier circuit includes a sense amplifier 300, a cell current generator 30, a first current amplifier 330, a second current amplifier 350, and a reference current generator 35.

The cell current generator 30 includes a memory cell array 310, a first current generator 320, and a second current generator 340. For a read operation, the first current generator 320 generates a current 13 that flows to a selected bit line in the memory cell array 310. In FIG. 3, current 13 is sum of the memory cell current IC and the bit line charge current IB. A selected memory cell, which is being read, is connected to a selected word line and the selected bit line. To be more specific, the memory cell array 310 includes the selected memory cell, which connected to the selected bit line and the selected word line, and switching means (e.g., row and column decoders) for enabling the word and bit lines a decoded address identifies. Also, the memory cell array 310, which receives the current 13 from the first current generator 320, enables the selected bit line corresponding to a selected column, and the sense amplifier 300 reads data.

The first current generator 320 of the cell current generator 30 generates a bit line input and output (IO) voltage (not shown) in response to a bias voltage. The first current generator 320 further generates a current I1, which is applied to the first current amplifier 330. The current I1 is a combination (e.g., sum) of the cell current IC applied to the memory cell, the bit line charge current IB for charging the bit line connected to the memory cell, and an offset current internal to the first current generator 320.

The second current generator 340 generates the offset current IT that is equal to the offset current in the first current generator and similar offset currents in the third and fourth current generators 360 and 370. The second current generator 340 generates an offset input and output voltage (not shown) in response to the bias voltage.

The reference current generator 35 includes a reference cell controller 380, a dummy bit line controller 390, the third current generator 360, and the fourth current generator 370. The reference current generator 35 independently generates a reference cell current I6, which is applied to the reference cell, and a separate dummy bit line charge current I9 for charging the dummy bit line.

The third current generator 360 of the reference current generator 35 generates a reference input and output voltage (not shown) in response to the bias voltage, and the reference cell current I6. The third current generator 360 also outputs a current I4, which is a combination of the generated reference cell current I6 and the offset current.

The fourth current generator 370 generates a dummy bit line input and output voltage (not shown) in response to the bias voltage, and the dummy bit line charge current I9 for charging the dummy bit line. The fourth current generator 370 additionally outputs current I7, which is a combination of the dummy bit line charge current I9 and the offset current.

The first current amplifier 330 can include a current mirror that mirrors the currents supplied by the first and second current generators 320 and 340. The first current amplifier 330 amplifies the current I1 of the first current generator 320 and the offset current IT of the second current generator 340, respectively, by predetermined factors and outputs the sum of the amplified currents as the first sense current IS1. Here, the current I1 from the first current generator 320 is preferably amplified by a factor of four, and the offset current IT from the second current generator 340 is preferably amplified by a factor of two.

The second current amplifier 350 similarly can include a current mirror that mirrors the currents supplied by the third and fourth current generators 360 and 370. The second current amplifier 350 amplifies the current I4 from the third current generator 360 and the current I7 of the fourth current generator 370 by predetermined factors and outputs the sum of the amplified currents as the second sense current IS2. The current I4 of the third current generator 360 is preferably amplified by a factor two, and the current I7 of the fourth current generator 370 is preferably amplified by a factor of four.

The sense amplifier 300 compares the first sense current IS1 output from the first current amplifier 330 to the second sense current IS2 output from the second current amplifier 350 and senses and amplifies the current difference. The output of the sense amplifier 300 is a data signal having a voltage output that indicates a data value. The data signal varies according to the current difference between the first sense current IS1 and the second sense current IS2.

As shown in FIG. 3, the current sense amplifier circuit, particularly the portion including the four current generators 320, 340, 360, and 370 and the two current amplifiers 330 and 350, is symmetrical with respect signals input to the sense amplifier 300. The symmetrical structure of the current sense amplifier circuit improves operational stability.

Figure 4:
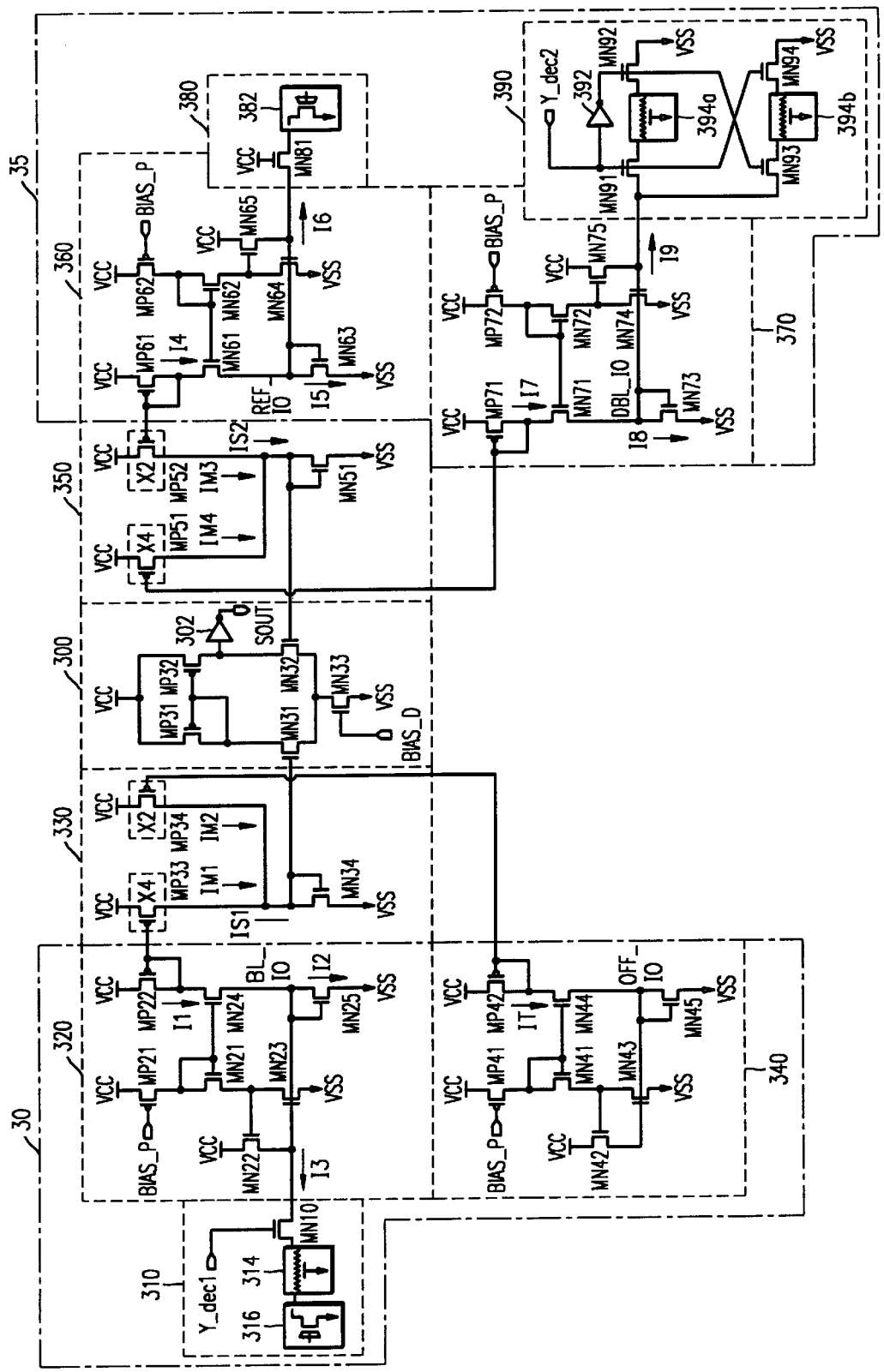
FIG. 4 is a circuit diagram of the current sense amplifier circuit shown in FIG. 3.

FIG. 4 is a detailed circuit diagram of the current sense amplifier circuit shown in FIG. 3. Referring to FIG. 4, the current sense amplifier circuit includes the sense amplifier 300, the cell current generator 30, the reference current generator 35, the first current amplifier 330, and the second current amplifier 350.

The memory cell array 310 of the cell current generator 30 of FIG. 4 includes a memory cell 316, a bit line 314, and a transistor MN10 for controlling the bit line 314. Here, the memory cell 316 is connected to one side of the bit line 314 and the other side of the bit line 314 is connected to the source of the transistor MN10. The gate of the transistor MN10 is connected to a column address Y_dec1 from a column decoder (not shown). Also, the drain of the transistor MN10 is connected to one side of the first current generator 320 and receives the current I3, which includes the bit line charge current and the cell current. When the decoded column address Y_dec1 turns on the transistor MN10, the first current generator 320 generates the current I3, which flows through the transistor MN10 to the bit line 14.

In the first current generator 320, the gate of a PMOS transistor MP21 is connected to a bias voltage BIAS_P. The source of the transistor MP21 is connected to a supply voltage VCC, and the drain of the transistor MP21 is connected in common to the drain and the gate of an NMOS transistor MN21. The source of the NMOS transistor MN21 is connected to the gate of an NMOS transistor MN22 and the drain of an NMOS transistor MN23. The source of the NMOS transistor MN22 is connected to the gate of the NMOS transistor MN23 and the source of the transistor MN10 of the memory cell array 310. Also, the source of the NMOS transistor MN23 is connected to reference potential VSS, and the gate of the NMOS transistor MN23 is connected in common to the gate and the drain of an NMOS transistor MN25.

Here, the first current generator 320 can be divided into a current generator for generating real current and a bias portion. Referring to FIG. 4, the current generator includes a PMOS transistor MP22 and NMOS transistors MN24 and MN25. The bias portion includes the PMOS transistor MP21 and the NMOS transistors MN21 and MN23. Also, the transistor MN22 is connected between the supply voltage VCC and the bit line 314. Before charging, the voltage of the bit line 314 is low and the gate voltage of the transistor MN22 is high. Therefore, the transistor MN22 turns on and helps to quickly increase the bit line potential by initially conducting a large amount of current from the supply voltage VCC. As the bit line 314 charges, the transistor MN23 turns on, which lowers the gate voltage of the transistor MN22 and shuts off the current through transistor MN22.

The current I1 through the transistors MP22 and MN24 in the first current generator 320 divides into two parts I2 and I3. The current I2 flows through the transistor MN25, and the current I3 flows to the memory cell array 310. Here, the current I3 is sum of the cell current IC transmitted through the memory cell 316 and the current IB charging in the bit line 314, and the current I2 is the offset current IT. When the bias voltage BIAS_P is applied, the PMOS transistor MP21 is turned on, and the drain potential of the transistor MP21 is transmitted to the gates of the NMOS transistors MN21 and MN24. At this time, the current I1, which flows through the PMOS transistor MP22, is the sum of the offset current I2, that is IT and the current I3, that is, IB+IC. Here, the current I3, which is transmitted through the transistor MN10 to the memory cell array 310, is larger than the current I2, and the current I2, which flows through the transistor MN25 having a diode connection, is negligible. The gate and drain potential of the NMOS transistor MN25 is a bit line IO voltage BL_IO and is determined by the bias voltage BIAS_P.

The second current generator 340 of the cell current generator 30 includes PMOS transistors MP41 and MP42, and NMOS transistors MN41 through MN45. Also, the second current generator 340, which is symmetrical with the fourth current generator 370 but does not connect to a bit line or dummy bit line, generates the same offset current IT as in the first current generator. The third and fourth current generators 360 and 370 contain similar structure. Therefore, the first, third, and fourth current generators 320, 360, and 370 similarly generate the same offset current IT. In the second current generator 340, the gate and drain potential of a transistor MN45 is by definition the offset input and output voltage OFF_10 and is determined by the bias voltage BAIS_P. The detailed operation of the second current generator 340 is similar to the operations of the first current generator 340 (and the third and fourth current generators 360 and 370). The detailed operation of the second current generator 340 differs from the operation of the first, third, and fourth current generators 340, 360, and 370 only in that the second current generator 340 does not transmit current to the outside (e.g., to a bit line, a reference cell, or a dummy bit line).

The reference cell controller 380 of the reference current generator 35 shown in FIG. 4 includes a reference cell 382 for receiving the reference cell current I6 supplied by the third current generator 360 via a transistor MN81 for controlling the reference cell. In one embodiment, the reference cell 382 is structurally identical to the memory cell 316 and has the programming state of a turned-on cell. The transistor MN81 connects the reference cell 382 to the third current generator 360 and provides a resistance corresponding to the resistance of the switching means (e.g., MN10) of the memory cell array 310. The gate of the transistor MN81 is connected to the supply voltage VCC so that transistor MN81 remains on. The current I6, which flows to the reference cell 382 through the transistor MN81, is approximately equal to the memory cell current IC through a turned-on cell. The current I6 always has a uniform value regardless of whether the memory cell in the memory cell array 310 is turned on or off.

The third current generator 360 includes PMOS transistors MP61 and MP62 and NMOS transistors MN61 through MN65. The third current generator 360 is symmetrical with the first current generator 320 and operates in a way similar to the way in which the first current generator 320 operates. However, the third current generator 360 differs from the first current generator 320 in that the third current generator 360 does not supply the memory cell current to the memory cell array but supplies the reference cell current IR to the reference cell controller 380. In the third current generator 360, the current I4 is the sum of the offset current I5 and the reference cell current I6. Here, the gate and drain potential of the transistor MN63 is the reference input and output voltage REF_10 and is determined by the bias voltage BAIS_P.

The fourth current generator 370 includes PMOS transistors MP71 and MP72 and NMOS transistors MN71 through MN75. The fourth current generator 370 operates in a way similar to the way in which the first current generator 320 and the second current generator 340 operate. The fourth current generator 370 differs from the first current generator 320 and the second current generator 340 only in that the fourth current generator 370 supplies the dummy bit line charge current I9 to a dummy bit line controller 390. In the fourth current generator 370, the current I7, which flows through the transistor MP71, is the sum of the offset current I8 which flows through the transistor MN73, which has a diode structure, and the dummy bit line charge current I9 applied to the external dummy bit line. Here, the dummy bit line charge current I9 is the same as dummy bit line charge current ID. The gate and drain potential of the transistor MN73 is the dummy bit line input and output voltage DBL_10 and is determined by the bias voltage BAIS_P.

The dummy bit line controller 390 includes an inverter 392, NMOS transistors MN91 through MN94, and one or more dummy bit lines 394a and 394b. Also, the dummy bit line controller 390 receives charge current I9 from the fourth current generator 370. A dummy bit line 394a or 394b is enabled in response to a column address Y_dec2 applied by a column decoder (not shown). The dummy bit line 394a is between the transistors MN91 and MN92, and the dummy bit line 394b is between the transistors MN93 and MN94. The gates of the transistors MN91 and MN94 receive the column address Y_dec2 decoded by the column decoder. The drain of the transistor MN91 is connected to the gate of the NMOS transistor MN74 of the third current generator 370, and the source of the transistor MN91 is connected to the dummy bit line 394a. The drain of the transistor MN94 is connected to the dummy bit line 394b, and the source of the transistor MN94 is connected to the reference potential VSS. The drain of the transistor MN92 is connected to the dummy bit line 394a, and the source of the transistor MN92 is connected to the reference potential VSS. The drain of the transistor MN93 is connected to the gate of the transistor MN74, and the source of the transistor MN93 is connected to the dummy bit line 394b. The inverter 392 inverts the column address Y_dec2 and applies the inversion result to the gates of the transistors MN92 and MN93.

When a bit line is selected and the column address Y_dec2 is enabled to a logic high level, the transistors MN91 and MN94 turn on, and the transistors MN92 and MN93 turn off. At this time, the current I9 charges the dummy bit line 394a, and the transistor MN94 discharges the dummy bit line 394b. Also, when the bit line is not selected and the column address Y_dec2 is at a logic low level, the transistor MN92 is turned on. Therefore, the charged in the dummy bit line 394a discharges. At this time, since the transistor MN93 is turned on, the dummy bit line charge current charges the dummy bit line 394b.

As mentioned above, the illustrated embodiment of dummy bit line controller 390 includes a pair of dummy bit lines and alternately charges and discharges the pair of dummy bit lines whenever a column address is applied. Therefore, the dummy bit line controller 390 does not need to discharge the dummy bit lines in order to make the voltage level of the dummy bit lines equal to the voltage level of the bit line which is not selected. Having a pair of dummy bit lines is very advantageous because alternate use of the bit lines avoids delays that might be otherwise required for discharging of a single dummy bit line.

The first current amplifier 330 includes PMOS transistors MP33 and MP34 and an NMOS transistor MN34. The sources of the PMOS transistors MP33 and MP34, are connected to the supply voltage VCC, and the drains of the PMOS transistors MP33 and MP34 and the drain of the NMOS transistor MN34 are connected to each other. The gate of the PMOS transistor MP33 is connected to the gate of the PMOS transistor MP22 of the first current generator 320, and the gate of the PMOS transistor MP34 is connected to the gate of the PMOS transistor MP42 of the second current generator 340. Preferably, the PMOS transistor MP33 has a structure where four transistors having the same size as the PMOS transistor MP22 are connected to each other in parallel. With the transistor MP33 appropriately sized, the sum of the cell current and the bit line charge current to which the offset current is added (IB+IC+IT) can be amplified by a factor of four. Also, the PMOS transistor MP34 can be a structure including two PMOS transistors that have the same size as transistor MP42 are are connected to each other in parallel. The transistor MP34 would thus conduct twice the offset current IT. Accordingly, in the illustrated embodiment, the first current amplifier 330 current mirrors that mirror the current I1 generated by the first current generator 320 and the offset current IT generated by the second current generator 340. In the first current amplifier 330, the gate and drain of the transistor MN34 having the diode structure are connected to the sources of the transistors MP33 and MP34 and the source of the transistor MN34 is connected to the reference potential VSS.

To be more specific, the current I1 which flows through the PMOS transistor MP22 of the first current generator 320, is mirrored as a current that is four times as large and flowing through the transistor MP33, which is realized as four transistors connected to each other in parallel. The current amplified four times is defined as the current IM1. Therefore, the current IM1, which flows through the transistor MP33, is 4*(IB+IC+IT). Also, the current IM2, which flows through the transistor MP34, is obtained by mirroring the current IT in the transistor MP42 which conducts a current equal to twice the offset current IT. Therefore, the current IM2 can be defined as IT*2. The first sense current IS1, which flows through the transistor MN34 having the diode structure, is the sum of the current IM1 and the current IM2 and can be defined as follows.

IS1=IM1+IM2=(IB+IC+IT)*4+IT*2         Equation 2

The second current amplifier 350 includes a current mirror for mirroring the current I4 obtained by adding the offset current IT generated by the third current generator 360 to the reference cell current IR and the current I7 obtained by adding the offset current IT to the dummy bit line charge current ID generated by the fourth current generator 370. The second current amplifier 330 includes PMOS transistors MP51 and MP52 and an NMOS transistor MN51. The sources of the PMOS transistors MP51 and MP52 are connected to the supply voltage VCC, and the source of NMOS transistor MN51 is connected to the reference voltage VSS. The drains of the PMOS transistors MP51 and MP52 are connected to each other and to the gate and drain of the NMOS transistor MN51. Here, the gate of the PMOS transistor MP52 is connected to the gate of the PMOS transistor MP61 of the second current generator 360, and the gate of the PMOS transistor MP51 is connected to the gate of the PMOS transistor MP71 of the fourth current generator 370. In the second current amplifier 350, the PMOS transistor MP52 can be a structure including two transistors that have the same size as the transistor MP61 and are connected in parallel. The transistor MP52 having the above structure amplifies the reference cell current (IR+IT) by a factor of two. Also, the PMOS transistor MP51 can be a structure including four PMOS transistors that have the same size as the transistor MP71 and are connected in parallel. The transistor MP51 having the above structure amplifies the dummy bit line charge current (ID+IT) by a factor of four.

To be more specific, the current I4, which flows through the PMOS transistor MP61 of the third current generator 360, is mirrored as a current that is twice as large and flows through the transistor MP52, which is realized as two transistors connected in parallel. When this amplified current amplified is referred to as the current IM3, and the current IM3 is 2*(IR+IT). Also, the current which flows through the transistor MP51 where the four transistors are connected in parallel four times as large as the current I7, which flows through the transistor MP71. When this amplified current is referred to as the current IM4, the current IM4 is equal to 4*(ID+IT). Referring to FIG. 4, the current ID is equal to the current I9, and the current IT is equal to the current I8. Therefore, the second sense current IS2, which flows through the transistor MN51, can be expressed as follows.

IS2=IM3+IM4=(IR+IT)*2+(ID+IT)*4         Equation 3

The sense amplifier 300 of FIG. 4 is an amplifier circuit having a differential structure and includes PMOS transistors MP31 and MP32, NMOS transistors MN31, MN32, and MN33, and an inverter 302. Here, the gates of the PMOS transistors MP31 and MP32 are connected to each other and the sources of the PMOS transistors MP31 and MP32 are connected to the supply voltage VCC. The drain of the PMOS transistor MP31 is connected to the gate thereof and the drain of the NMOS transistor MN31. The gate of the NMOS transistor MN31 is connected to the drain and gate of the NMOS transistor MN34 of the first current amplifier 330. Also, the drain of the PMOS transistor MP32 is connected to the drain of the NMOS transistor MN32, and the gate of the NMOS transistor MN32 is connected to the drain and gate of the NMOS transistor MN51 of the second current amplifier 350. The sources of the NMOS transistors MN31 and MN32 are connected to the drain of the NMOS transistor MN33. The gate of the NMOS transistor MN33 is connected to the bias voltage BIAS_D, and the source of the NMOS transistor MN33 is connected to the reference potential VSS. The drain of the NMOS transistor MN32 is connected to the input of the inverter 302, and the output of the inverter 302 is an output terminal SOUT.

The sense amplifier 300 controls a voltage difference between the gate and source of the transistor MN31 by the amount of first sense current IS1, which flows through the transistor MN34 of the first current amplifier 330. Also, a voltage difference between the gate and source of the transistor MN32 is changed by the amount of second sense current IS2, which flows through the transistor MN51 of the second current amplifier 350.

To be more specific, when the first sense current IS1 is equal to the second sense current IS2, the drain potential of the NMOS transistor MN32 is maintained to be uniform to correspond to the distributed resistance values of the transistors MP32 and MN32. However, when one of the first sense current IS1 and the second sense current IS2 is larger than the other, the voltage difference between the gate and source of the transistor MN31 or MN32 is changed in response to the sensed current difference. Accordingly, the drain potential of the transistor MN32 changes, and the voltage output through the output terminal SOUT changes.

For example, when the cell transistor is turned on, the first sense current IS1 is 4*(IB+IT+IC)+2*IT, and the second sense current IS2 is 4*(IT+ID)+2*(IR+IT). Therefore, the voltage difference between the gate and source of the transistor MN31 increases since the difference between the amount of first sense current IS1 and the amount of second sense current IS2 is about 2*IR according to Equation 1. Therefore, more current flows through the transistor MN31. Accordingly, the drain potential of the transistor MN32 becomes higher. As a result, the voltage level output through the inverter 302 to the output terminal SOUT decreases.

In the case of a turned-off cell, the cell current IC is nearly zero in the first sense current IS1. Accordingly, the second sense current IS2 becomes larger. Therefore, the difference between the first sense current IS1 and the second sense current IS2 becomes −2*IR according to Equation 1. At this time, since IR is almost the same as the cell current IC for a turned-on cell. Therefore, since the voltage difference between the gate and source of the transistor MN32 increases, more current flows through the transistor MN32. Therefore, the drain potential of the transistor MN32 is reduced. Accordingly, the voltage level inverted by the inverter 302 decreases, and the output voltage of the output terminal SOUT increases.

The data sensing operations of the current sense amplifier circuit according to the present invention in the cases of the turned-on cell and the turned-off cell are affected only by the cell current IC regardless of the bit line charge current, as mentioned above.

Figure 5:
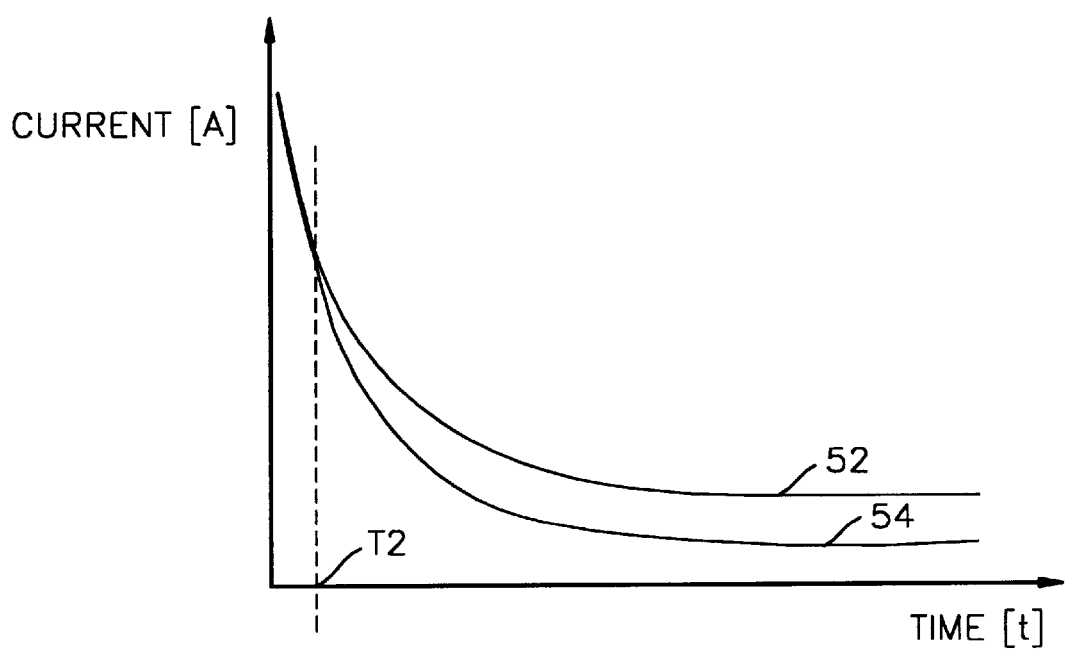
FIG. 5 illustrates the data sensing operation of the current sense amplifier circuit shown in FIG. 3 in the case of the turned-off cell.

FIG. 5 illustrates the data sensing operation of the current sense amplifier circuit according to the exemplary embodiment of the present invention when the selected memory cell is a turned-off cell. Referring to FIG. 5, reference numerals 52 and 54 denote the reference current and the bit line charge current, respectively. Also, T2 denotes a point in time at which data is sensed in the case of the turned-off cell. More particularly, the reference current 52 is set to be the combination of alternating current (AC) dummy bit line charge current ID and direct current (DC) reference cell current IR. Since the dummy bit line charge current ID is equal to the bit line charge current IB (54 in FIG. 5), the reference current 52 follows the bit line charge current IB 54. However, the difference between the reference current 52 and the bit line charge current IB 54 is constant. As a result, it is possible to sense data within a short time regardless of the bit line charge current. The data sensing time T1 of the conventional current sense amplifier circuit is longer than the data sensing time T2 of the current sense amplifier circuit according to the present invention. According to the current sense amplifier circuit of the present invention, it is possible to sense the data at high speed regardless of the bit line charge current in the case of the turned-off cell and to operate more stably since the entire circuit has a symmetrical structure.

Although the invention has been described with reference to particular embodiments, the description is only an example of the invention's application and should not be taken as a limitation. Various adaptations and combinations of features of the embodiments disclosed are within the scope of the invention as defined by the following claims.

What is claimed is:

1. A current sense amplifier circuit comprising:
a cell current generator comprising a memory cell connected to a word line and a bit line, the cell current generator generating a memory cell current that is applied to the memory cell and a bit line charge current for charging the bit line;
a reference current generator comprising a dummy bit line and a reference cell, the reference current generator generating a reference cell current that is applied to the reference cell and a dummy bit line charge current for charging the dummy bit line;
a sense amplifier comprising a first input terminal connected to the cell current generator for receiving the memory cell current and the bit line charge current and a second input terminal connected to the reference current generator for receiving the reference cell current and the dummy bit line charge current, wherein the sense amplifier senses and amplifies the difference between current applied through the first input terminal and current applied through the second input terminal;
a first current path coupling the reference current generator to the reference cell, wherein the reference cell current is applied to the reference cell over the first current path; and
a second current path coupling the reference current generator to the dummy bit line, wherein the dummy bit line charge current is applied to the dummy bit line over the second current path;
wherein the first current path and the second current path are independent of one another.

2. The current sense amplifier circuit of claim 1, wherein the current sense amplifier circuit further comprises a current amplifier connected between the cell current generator and the first input terminal of the sense amplifier, the current amplifier amplifying the current output from the cell current generator.

3. The current sense amplifier circuit of claim 2, wherein the current amplifier amplifies a current obtained by adding the bit line charge current, the memory cell current, and an offset current, amplifies the offset current, generates an addition result by combining amplified currents, and applies the addition result to the first input terminal of the sense amplifier.

4. The current sense amplifier circuit of claim 1, wherein the current sense amplifier circuit further comprises a current amplifier connected between the reference current generator and the second input terminal of the sense amplifier, the current amplifier amplifying the current applied from the reference current generator.

5. The current sense amplifier circuit of claim 4, wherein the current amplifier amplifies reference current to which the offset current is added and dummy bit line charge current to which the offset current is added, respectively, adds resulting amplified currents to each other, and applies an addition result to the second input terminal of the sense amplifier.

6. A current sense amplifier circuit comprising:
a cell current generator comprising a memory cell connected to a word line and a bit line, the cell current generator generating a memory cell current that is applied to the memory cell and a bit line charge current for charging the bit line;
a reference current generator comprising a dummy bit line and a reference cell, the reference current generator generating a reference cell current that is applied to the reference cell and a dummy bit line charge current for charging the dummy bit line;
a sense amplifier comprising a first input terminal connected to the cell current generator for receiving the memory cell current and the bit line charge current and a second input terminal connected to the reference current generator for receiving the reference cell current and the dummy bit line charge current, wherein the sense amplifier senses and amplifies the difference between current applied through the first input terminal and current applied through the second input terminal;
a first current amplifier connected between the cell current generator and the first input terminal of the sense amplifier, the first current amplifier amplifying the current output from the cell current generator, wherein the first current amplifier amplifies a current obtained by adding the bit line charge current, the memory cell current, and an offset current, amplifies the offset current, generates an addition result by combining amplified currents, and applies the addition result to the first input terminal of the sense amplifier; and
a second current amplifier connected between the reference current generator and the second input terminal of the sense amplifier, the second current amplifier amplifying the current applied from the reference current generator, wherein the second current amplifier amplifies reference current to which the offset current is added and dummy bit line charge current to which the offset current is added, respectively, adds resulting amplified currents to each other, and applies an addition result to the second input terminal of the sense amplifier;

wherein:

the first current amplifier amplifies the bit line charge current with a first amplification factor;

the second current amplifier amplifies the dummy bit line charge current with the first amplification factor; and the second current amplifier amplifies the cell reference current with a second amplification factor that is equal to that of half the first amplification factor.

7. A current sense amplifier circuit comprising:

a cell current generator comprising a memory cell connected to a word line and a bit line, the cell current generator generating a memory cell current that is applied to the memory cell and a bit line charge current for charging the bit line;

a reference current generator comprising a dummy bit line and a reference cell, the reference current generator generating a reference cell current that is applied to the reference cell and a dummy bit line charge current for charging the dummy bit line;

a sense amplifier comprising a first input terminal connected to the cell current generator for receiving the memory cell current and the bit line charge current and a second input terminal connected to the reference current generator for receiving the reference cell current and the dummy bit line charge current, wherein the sense amplifier senses and amplifies the difference between current applied through the first input terminal and current applied through the second input terminal;

a first current amplifier connected between the cell current generator and the first input terminal of the sense amplifier, the first current amplifier amplifying the current output from the cell current generator, wherein the first current amplifier amplifies a current obtained by adding the bit line charge current, the memory cell current, and an offset current, amplifies the offset current, generates an addition result by combining amplified currents, and applies the addition result to the first input terminal of the sense amplifier; and a second current amplifier connected between the reference current generator and the second input terminal of the sense amplifier, the second current amplifier amplifying the current applied from the reference current generator, wherein the second current amplifier independently amplifies the cell reference current and the dummy bit line charge current.

8. A current sense amplifier circuit comprising:

a cell current generator comprising a memory cell connected to a word line and a bit line, the cell current generator generating a memory cell current that is applied to the memory cell and a bit line charge current for charging the bit line;

a reference current generator comprising a dummy bit line and a reference cell, the reference current generator generating a reference cell current that is applied to the reference cell and a dummy bit line charge current for charging the dummy bit line;

a sense amplifier comprising a first input terminal connected to the cell current generator for receiving the memory cell current and the bit line charge current and a second input terminal connected to the reference current generator for receiving the reference cell current and the dummy bit line charge current, wherein the sense amplifier senses and amplifies the difference between current applied through the first input terminal and current applied through the second input terminal;

wherein the cell current generator further comprises:

a first current generator that generates the memory cell current and the bit line charge current and outputs a result of adding the memory cell current, the bit line charge, and an offset current; and a second current generator that generates a current equal to the offset current in the first current generator.

9. The current sense amplifier circuit of claim 8, wherein the reference current generator further comprises:

a third current generato that generates the reference cell current and outputs a result of adding the reference cell current to the offset current; and a fourth current generator that generates dummy bit line charge current and outputs a result of adding the dummy bit line charge current to the offset current.

10. A current sense amplifier circuit comprising:

a cell current generator comprising a memory cell connected to a word line and a bit line, the cell current generator generating a memory cell current that is applied to the memory cell and a bit line charge current for charging the bit line;

a reference current generator comprising a dummy bit line and a reference cell, the reference current generator generating a reference cell current that is applied to the reference cell and a dummy bit line charge current for charging the dummy bit line; and a sense amplifier comprising a first input terminal connected to the cell current generator for receiving the memory cell current and the bit line charge current and a second input terminal connected to the reference current generator for receiving the reference cell current and the dummy bit line charge current, wherein the sense amplifier senses and amplifies the difference between current applied through the first input terminal and current applied through the second input terminal;

wherein the reference current generator comprises a pair of dummy bit lines that alternately operate such that one is charged and the other is discharged when a column address is applied.

11. A sense amplifier circuit comprising:

a first current generator that generates a first current according to a current flowing to a bit line coupled to a memory cell being read;

a second current generator that generates a second current according to a current flowing to charge a dummy bit line;

a third current generator that generates a third current that is a constant reference cell current;

a first current amplifier coupled to receive the first current from the first current generator;

a second current amplifier coupled to receive the second and third currents respectively from the second and third current generators; and a differential amplifier coupled to the first and second current amplifiers, the differential amplifier generating a data signal according to a difference between first and second output signals respectively from the first and second current amplifiers.

12. The sense amplifier circuit of claim 11, wherein:

the first current is equal to a sum of the current flowing to the bit line coupled to the memory cell being read and an offset current; and the sense amplifier circuit further comprises a fourth current generator that is coupled to the first current amplifier, the fourth current generator generating a fourth current that is equal to the offset current.

13. The sense amplifier circuit of claim 12, wherein:

the second current is equal to a sum of the current flowing to charge the dummy bit line and the offset current; and the third current is equal to a sum of a current flowing through a memory cell in a conductive state and the offset current.

14. A sense amplifier circuit comprising:

a first current generator that generates a first current according to a current flowing to a bit line coupled to a memory cell being read, wherein the first current is equal to a sum of the current flowing to the bit line coupled to the memory cell being read and an offset current;

a second current generator that generates a second current according to a current flowing to charge a dummy bit line, wherein the second current is equal to a sum of the current flowing to charge the dummy bit line and the offset current;

a third current generator that generates a third current that is a constant reference cell current, wherein the third current is equal to a sum of a current flowing through a memory cell in a conductive state and the offset current;

a first current amplifier coupled to receive the first current from the first current generator;

a fourth current generator that is coupled to the first current amplifier, the fourth current generator generating a fourth current that is equal to the offset current;

a second current amplifier coupled to receive the second and third currents respectively from the second and third current generators; and a differential amplifier coupled to the first and second current amplifiers, the differential amplifier generating a data signal according to a difference between first and second output signals respectively from the first and second current amplifiers;

wherein:

the first current amplifier amplifies the first current by a first factor, amplifies the fourth current by a second factor, and outputs to the differential amplifier the first output signal, which provides a current equal to a sum of currents resulting from the amplifications of the first and fourth currents; and the second current amplifier amplifies the second current by the first factor, amplifies the third current by the second factor, and outputs to the differential amplifier the second output signal, which provides a current equal to a sum of currents resulting from the amplifications of the second and third currents.

15. The sense amplifier circuit of claim 14, wherein the first factor is twice the second factor.

16. A current sense amplifier circuit comprising:

a cell current generator comprising a memory cell connected to a word line and a bit line, the cell current generator generating a memory cell current that is applied to the memory cell and a bit line charge current for charging the bit line;

a reference current generator comprising a dummy bit line and a reference cell, the reference current generator generating a reference cell current that is applied to the reference cell and a dummy bit line charge current for charging the dummy bit line;

a sense amplifier comprising a first input terminal connected to the cell current generator for receiving the memory cell current and the bit line charge current and a second input terminal connected to the reference current generator for receiving the reference cell current and the dummy bit line charge current, wherein the sense amplifier senses and amplifies the difference between current applied through the first input terminal and current applied through the second input terminal;

a first current amplifier connected between the cell current generator and the first input terminal of the sense amplifier, the first current amplifier amplifying the current applied from the cell current generator; and a second current amplifier connected between the reference current generator and the second input terminal of the sense amplifier, the second current amplifier amplifying the current applied from the reference current generator;

wherein the first current amplifier amplifies the bit line charge current with a first amplification factor, the second current amplifier amplifies the dummy bit line charge current with the first amplification factor, and the second current amplifier amplifies the reference cell current with a second amplification factor that is equal to that of half the first amplification factor.

17. A current sense amplifier circuit comprising:

a cell current generator comprising a memory cell connected to a word line and a bit line, the cell current generator generating a memory cell current that is applied to the memory cell and a bit line charge current for charging the bit line;

a reference current generator comprising a dummy bit line and a reference cell, the reference current generator generating a reference cell current that is applied to the reference cell and a dummy bit line charge current for charging the dummy bit line;

a sense amplifier comprising a first input terminal connected to the cell current generator for receiving the memory cell current and the bit line charge current and a second input terminal connected to the reference current generator for receiving the reference cell current and the dummy bit line charge current, wherein the sense amplifier senses and amplifies the difference between current applied through the first input terminal and current applied through the second input terminal; and a current amplifier connected between the reference current generator and the second input terminal of the sense amplifier, the current amplifier amplifying the current applied from the reference current generator, wherein the current amplifier independently amplifies the reference cell current and the dummy bit line charge current.

* * * * *